(12) United States Patent
Lee et al.

(10) Patent No.: US 8,619,762 B2
(45) Date of Patent: Dec. 31, 2013

(54) LOW POWER DESERIALIZER AND DEMULTIPLEXING METHOD

(75) Inventors: ChulKyu Lee, San Diego, CA (US); George Alan Wiley, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 555 days.

(21) Appl. No.: 12/147,326

(22) Filed: Jun. 26, 2008

(65) Prior Publication Data

US 2009/0323731 A1 Dec. 31, 2009

(51) Int. Cl.
*H04L 12/50* (2006.01)
*H04Q 11/04* (2006.01)

(52) U.S. Cl.
CPC .................................... *H04Q 11/04* (2013.01)
USPC ............................................. 370/366; 377/69

(58) Field of Classification Search
USPC ........................ 377/64–81; 370/366, 535, 536
See application file for complete search history.

(56) References Cited

U.S. PATENT DOCUMENTS

| | | | |
|---|---|---|---|
| 5,301,196 A | 4/1994 | Ewen et al. | |
| 5,648,776 A | 7/1997 | Widmer | |
| 6,236,686 B1 * | 5/2001 | Kamishima | 375/295 |
| 6,496,540 B1 | 12/2002 | Widmer | |
| 6,535,527 B1 * | 3/2003 | Duffy | 370/509 |
| 6,696,995 B1 | 2/2004 | Foley et al. | |
| 6,768,429 B2 | 7/2004 | Kuo et al. | |
| 6,970,115 B1 * | 11/2005 | Sardi et al. | 341/100 |
| 7,342,520 B1 | 3/2008 | Katzman et al. | |
| 7,355,534 B2 | 4/2008 | Azami et al. | |
| 2002/0129307 A1 * | 9/2002 | Walker et al. | 714/715 |
| 2007/0160139 A1 * | 7/2007 | Vasquez et al. | 375/240.08 |

FOREIGN PATENT DOCUMENTS

| | | |
|---|---|---|
| JP | 6276248 A | 9/1994 |
| JP | 11145944 A | 5/1999 |
| JP | 2003032121 A | 1/2003 |
| JP | 2003243991 A | 8/2003 |
| JP | 2004336558 A | 11/2004 |

OTHER PUBLICATIONS

International Search Report/Written Opinion—PCT/US2009/048720—International Search Authority EPO—Oct. 14, 2009.
Dobkin, R.R., et al., "Fast asynchronous shift register for bit-serial communication", a synchronous Circuits and Systems, 2006, 12th IEEE International Symposium on, vol, no, p. 10, p. 127, Mar. 13-15, 2006.
Taiwan Search Report—TW098121703—TIPO—Mar. 12, 2013.
Tobajas, F., et al., "A Low Power 2.5 Gbps 1:32 Deserializer in SiGe BiCMOS Technology", Design and Diagnostics of Electronic Circuits and systems, 2006 IEEE, vol, no, pp. 19-24.

* cited by examiner

*Primary Examiner* — Mark Rinehart
*Assistant Examiner* — Matthew Hopkins
(74) *Attorney, Agent, or Firm* — Ramin Mobarhan

(57) ABSTRACT

A deserializer circuit and method convert a serial bit stream into a parallel bit stream according to a parallel grouping. The deserializer and method include alternatingly demultiplexing a serial data stream into first and second bit streams. The first and second bit streams are respectively serially shifted along a first plurality of shift registers and a second plurality of shift registers. A first portion of the first bit stream in the first plurality of shift registers is selected and a second portion of the second bit stream in the second plurality of shift registers is also selected. A parallel group of data in a parallel data stream is formed from the first and second portions.

28 Claims, 10 Drawing Sheets

LOW POWER DESERIALIZER AND DEMULTIPLEXING METHOD

BACKGROUND

1. Field

The present disclosed exemplary embodiments relates generally to serially decoding, and more specifically to demultiplexing a serial data stream into a parallel data stream.

2. Background

In the field of interconnect technologies, demand for ever increasing data rates, especially as related to video presentation, continues to grow. One adaptive interface for facilitating increasing data rates is a high-speed serial link (HSSL) which is a cost-effective, low-power consumption, transfer mechanism that enables very-high-speed data transfer over a short-range communication link between a host and a client. Generally, a high-speed serial link requires a minimum of just four wires plus power for bi-directional data transfer that delivers a maximum bandwidth of several gigabits per second.

In one application, a high-speed serial link increases reliability and decreases power consumption, for example, in two-part handsets by significantly reducing the number of wires that traverse across a handset's two-part interface for interconnecting, for example, the digital baseband processor portion with the display portion. This reduction of wires also allows handset manufactures to lower development costs by simplifying the two-part handset designs.

Other high-speed data transfer applications also benefit from serial-based data transfer. High-speed data transfer needs result in a demand on physical layers to provide gigabit per second speeds over serial data links. In order to reduce the effects of serial data transfer, the data may be encoded or formatted into 8B/10B code to provide better DC-balance by limiting the run-lengths of "1's" and "0's" to five. Accordingly, when serial data in 8B/10B format is received, a deserializer needs to perform serial-to-parallel conversion of the serial stream and further align the 10-bit words for decoding.

In the deserialization process, a demultiplexer is used to provide serial-to-parallel conversion. For power limited applications, the demultiplexer can consume significant power resulting in a reduction in system performance. Accordingly, there is a need for serial-to-parallel conversion and alignment of parallel data into words for parallel processing of the data that requires less power than prior solutions.

DETAILED DESCRIPTION

Figure 1:
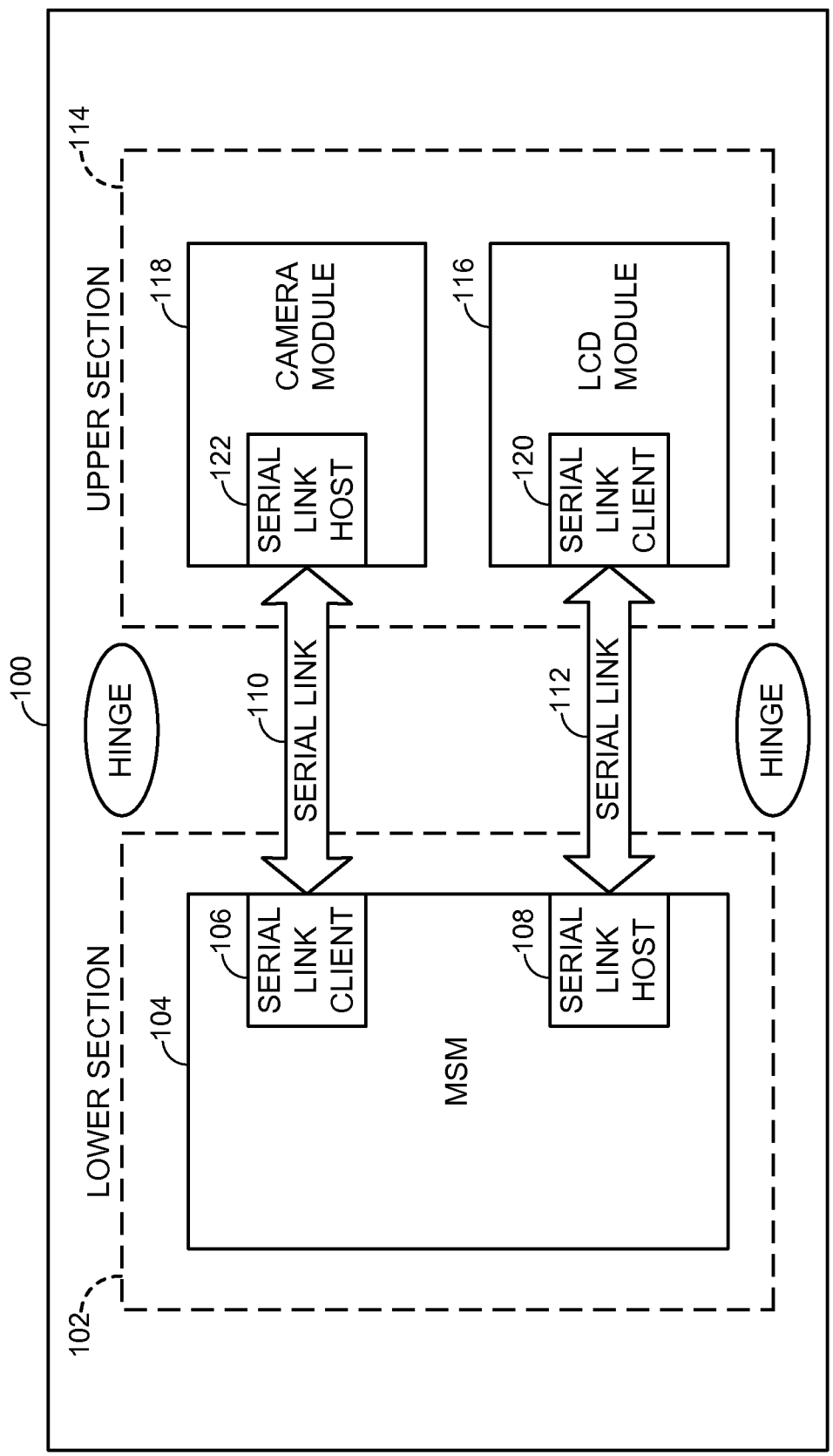
FIG. 1 is a block diagram illustrating an example environment using high-speed serial link interface.

This specification discloses one or more exemplary embodiments that incorporate the features of this invention. The disclosed exemplary embodiments merely exemplify the invention. The scope of the invention is not limited to the disclosed exemplary embodiments. The invention is defined by the claims appended hereto.

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Various exemplary embodiments for converting a serialized data stream into a parallel data stream are described herein. In one exemplary embodiment, a deserializer for converting a serial data stream into a parallel data stream is disclosed. The deserializer includes a first demultiplexer including an input configured to receive a first serial data stream and first and second outputs configured to alternatingly output successive bits of the first serial data stream on the first and second outputs. The deserializer also includes a first and second plurality of serially configured shift registers respectively coupled to the first and second outputs. The deserializer further includes a first selector including a plurality of multiplexers. Each of the multiplexers includes at least two inputs and a selectable output forming a portion of a first parallel data stream. Furthermore, a first input on one of the plurality of multiplexers couples to the first plurality of shift registers and a second input on the one of the plurality of multiplexers couples to the second plurality of shift registers.

In another exemplary embodiment, a deserializer for converting a serial data stream into a parallel data stream is disclosed. The deserializer includes an asynchronous demultiplexer configured to receive a serial data stream and first and second demultiplexers respectively coupled to outputs of the asynchronous demultiplexer. Additionally, the first and second demultiplexers each include a plurality of serially configured shift registers and further include a selector coupled to the plurality of serially configured shift registers. The selector is further configured to output a grouping of a non-$2^N$ quantity of data in the parallel data stream.

In a further exemplary embodiment, a method for deserializing a serial bit stream is disclosed. The method includes alternatingly demultiplexing a serial data stream into first and second bit streams. The first and second bit streams are respectively serially shifted along a first plurality of serially configured shift registers and a second plurality of serially configured shift registers. A first portion of the first bit stream in the first plurality of serially configured shift registers is selected and a second portion of the second bit stream in the second plurality of serially configured shift registers is also selected. A parallel group of data in a parallel data stream is formed from the first and second portions.

Exemplary embodiments of the invention may be implemented in hardware, firmware, software, or any combination thereof. Exemplary embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

A high-speed serial link is a cost-effective, low power consumption, transfer mechanism that enables very-high-speed serial data transfer over a short-range communication link between a host and a client. In the following, examples of high-speed serial links will be presented with respect to a camera module contained in an upper portion of a handset of, for example, a mobile phone. However, it would be apparent to persons skilled in the relevant art(s) that any module having functionally equivalent features to the camera module could be readily substituted and used in exemplary embodiments of this invention.

Further, according to exemplary embodiments of the invention, a high-speed serial link host may comprise one of several types of devices that can benefit from using the present invention. For example, the host could be a portable computer in the form of a handheld, laptop, or similar mobile computing device. It could also be a Personal Data Assistant (PDA), a paging device, or one of many wireless telephones or modems. Alternatively, the host could be a portable entertainment or presentation device such as a portable DVD or CD player, or a game playing device.

Furthermore, the host can reside as a host device or control element in a variety of other widely used or planned commercial products for which a high speed communication link is desired with a client. For example, a host could be used to transfer data at high rates from a video recording device to a storage based client for improved response, or to a high resolution larger screen for presentations. An appliance such as a refrigerator that incorporates an onboard inventory or computing system and/or Bluetooth connections to other household devices, can have improved display capabilities when operating in an internet or Bluetooth connected mode, or have reduced wiring needs for in-the-door displays (a client) and keypads or scanners (client) while the electronic computer or control systems (host) reside elsewhere in the cabinet. In general, those skilled in the art will appreciate the wide variety of modern electronic devices and appliances that may benefit from the use of this interface, as well as the ability to retrofit older devices with higher data rate transport of information utilizing limited numbers of conductors available in either newly added or existing connectors or cables.

At the same time, a high-speed serial link client may comprise a variety of devices useful for presenting information to an end user, or presenting information from a user to the host. For example, a micro-display incorporated in goggles or glasses, a projection device built into a hat or helmet, a small screen or even holographic element built into a vehicle, such as in a window or windshield, or various speaker, headphone, or sound systems for presenting high quality sound or music. Other presentation devices include projectors or projection devices used to present information for meetings, or for movies and television images. Another example would be the use of touch pads or sensitive devices, voice recognition input devices, security scanners, and so forth that may be called upon to transfer a significant amount of information from a device or system user with little actual "input" other than touch or sound from the user.

In addition, docking stations for computers and car kits or desk-top kits and holders for wireless telephones may act as interface devices to end users or to other devices and equipment, and employ either clients (output or input devices such as mice) or hosts to assist in the transfer of data, especially where high speed networks are involved. However, those skilled in the art will readily recognize that the present invention is not limited to these devices, there being many other devices on the market, and proposed for use, that are intended to provide end users with high quality images and sound, either in terms of storage and transport or in terms of presentation at playback. The present invention is useful in increasing the data throughput between various elements or devices to accommodate the high data rates needed for realizing the desired user experience.

FIG. 1 is a block diagram illustrating an example environment using high-speed serial link interface. In the example of FIG. 1, a high-speed serial link is used to interconnect modules across the hinge of a two-part handset 100. It must be noted here that while certain exemplary embodiments of the present invention will be, described in the context of specific examples, such as high-speed serial link interconnections in a two-part handset, this is done for illustration purposes only and should not be used to limit the present invention to such exemplary embodiments. As will be understood by a person skilled in the relevant art(s) based on the teachings herein, exemplary embodiments of the present invention may be used in other devices including any that may benefit from having high-speed serial link interconnections.

Referring to FIG. 1, a lower section 102 of two-part handset 100 includes a Mobile Station Modem (MSM) baseband chip 104. MSM 104 is a digital baseband controller. An upper section 114 of two-part handset 100 includes a Liquid Crystal Display (LCD) module 116 and a camera module 118.

Still referring to FIG. 1, a high-speed serial link 110 connects camera module 118 to MSM 104. Typically, a high-speed serial link controller is integrated into each of camera module 118 and MSM 104. In the example of FIG. 1, a high-speed serial link host 122 is integrated into camera module 112, while a high-speed serial link client 106 resides on the MSM side of the high-speed serial link 110. Typically, the high-speed serial link host is the master controller of the high-speed serial link. In the example of FIG. 1, pixel data from camera module 118 are received and formatted into high-speed serial link packets by high-speed serial link host 122 before being transmitted onto high-speed serial link 110. High-speed serial link client 106 receives the high-speed serial link packets and re-converts them into pixel data of the same format as generated by camera module 118. The pixel data are then sent to an appropriate block in MSM 104 for processing.

Still referring to FIG. 1, a high-speed serial link 112 connects LCD module 116 to MSM 104. In the example of FIG. 1, high-speed serial link 112 interconnects a high-speed serial link host 108, integrated into MSM 104, and a high-speed serial link client 120 integrated into LCD module 116. In the example of FIG. 1, display data generated by a graphics controller of MSM 104 are received and formatted into high-speed serial link packets by high-speed serial link host 108 before being transmitted onto high-speed serial link 112. High-speed serial link client 120 receives the high-speed serial link packets and re-converts them into display data for use by LCD module 116.

Figure 2:
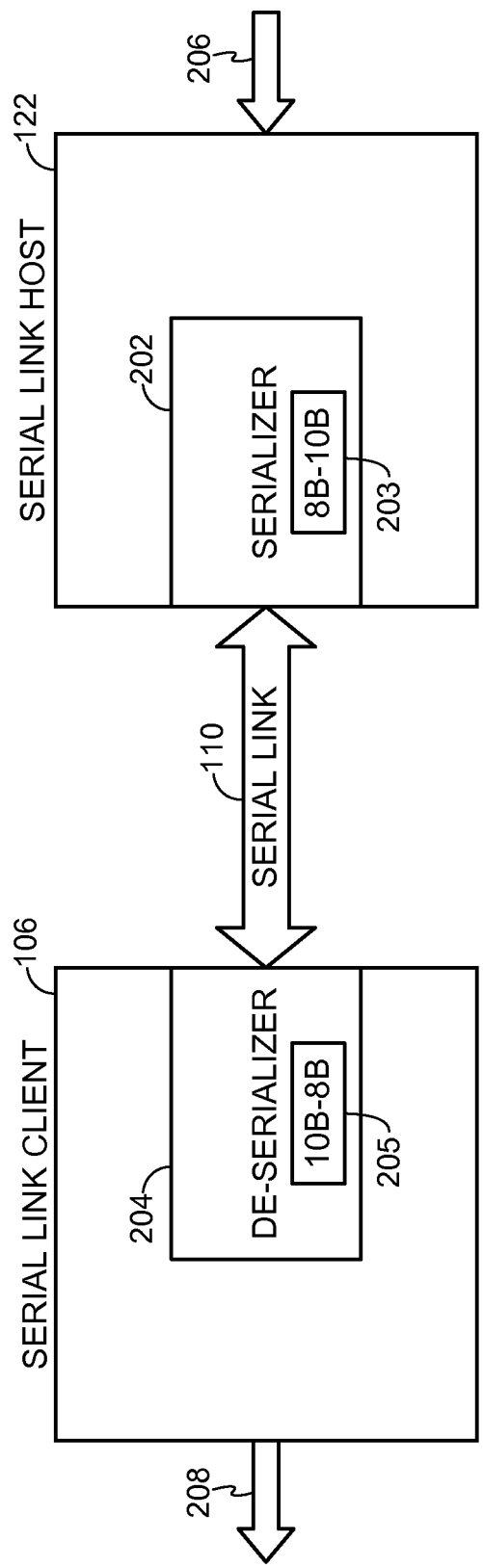
FIG. 2 is a block diagram illustrating a high-speed serial link interconnection according to the example of FIG. 1.

FIG. 2 is a block diagram illustrating a high-speed serial link interconnection 110 according to the example of FIG. 1. As described above, one of the functions of high-speed serial link 110 is to transfer pixel data from camera module 118 to MSM 104. Accordingly, in the exemplary embodiment of FIG. 2, a frame interface 206 connects camera module 118 to high-speed serial link host 122. The frame interface 206 serves to transfer pixel data from camera module 118 to high-speed serial link host 122.

Typically, camera module 118 receives pixel data from a camera through a parallel interface, stores the pixel data, and then transfers it to high-speed serial link host 122 when the host is ready. High-speed serial link host 122 encapsulates the received pixel data into high-speed serial link packets. However, in order for high-speed serial link host 122 be able to transmit the pixel data onto high-speed serial link 110, a serialization of the high-speed serial link packets is necessary.

In the exemplary embodiment of FIG. 2, a serializer module 202 including a physical layer encoder 203 (e.g., 8B/10B encoder), integrated within high-speed serial link host 122, serves to serially shift out the high-speed serial link packets onto high-speed serial link 110. At the MSM end of high-speed serial link 110, a deserializer module 204 including a physical layer decoder 205 (e.g., 8B/10B decoder), integrated, within high-speed serial link client 106, re-constructs the high-speed serial link packets from the serial data received over high-speed serial link 110. High-speed serial link client 106 then removes any encapsulation and transfers the parallel pixel data through a frame interface 208 to an appropriate block of MSM 104.

Deserializer module 204 may typically include various forms of demultiplexers for converting serial data streams into parallel data streams. However, as the bit transfer rate of the serial bit stream increases, power consumption within the deserializer can also substantially increase. Determination of power consumption in the deserializer is due, in part, to the switching frequencies at a rate near the data transfer rate. As stated, the deserializer is generally found within the physical layer and is responsible for supporting encoding or protocol schemes of an Open System Interconnection ("OSI") model. The serialization and deserialization process is also sometimes referred to as "SERDES".

Accordingly, various deserializer architectures may be implemented. For example, a conventional shift register architecture may be adequate for slower data rates. Generally, as the serial bit stream is received at the shift registers, a first clock signal shifts the serial bits into the registers and outputs the corresponding parallel bit streams from each stage according to a second slower clock. However, as the serial bit rate increases, clocking the data storage elements of the shift registers consumes substantial amounts of power.

Other architectures utilizing $2^N$ fan-out such as 1-to-2 demultiplexer tree architectures are also possible. However, when non-$2^N$ encoding, such as 8B/10B or odd-bit number schemes, are utilized, inefficiencies are introduced which result in unnecessary power consumption. While various architectures have certain advantages and disadvantages based on the data rate and serial data encoding, a deserializer architecture that includes excessive data storage elements or latches consumes greater power than an architecture containing fewer storage elements or latches.

In order to compare various architectures, power consumption is normalized based upon a quantity of latches or "flip-flops" multiplied by the switching frequency of the specific latch. By way of example and not limitation, the various exemplary embodiments described herein illustrate deserializers for grouping serial data encoded according to various encoding schemes including 8B/10B encoding which generally serializes 8-bits into a 10-bit bit stream at the serializer and then requires that 10-bit parallel groups are formed at the deserializer for decoding.

Figure 3:
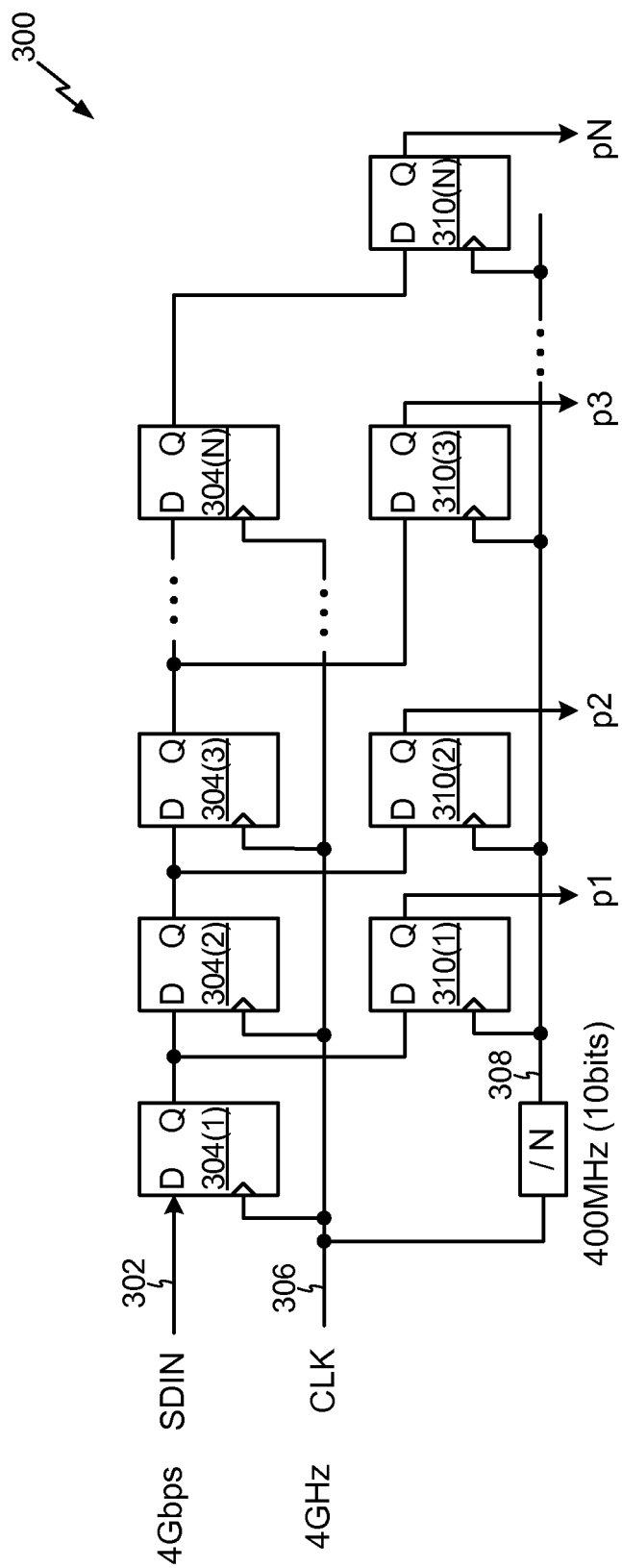
FIG. 3 illustrates a deserializer configured according to a serially configured shift register-type architecture.

FIG. 3 illustrates a deserializer 300 configured according to a serial-in/parallel-out shift register-type architecture. Serial data 302 is illustrated as being received over a link, for example, at a 4 Gbits per second data rate and is serially clocked into serial shift registers 304 according to a serial input clock 306 operating, for example, at 4 GHz. In the present example of an 8B/10B serially encoded bit stream, N is equal to ten resulting in ten serially configured shift registers 304(1-10). Accordingly, when ten bits of serial data have been serially clocked into shift registers 304(1-10), a divide-by-N clock 308 latches a 10-bit group of serial data into ten parallelly configured shift registers 310(1-10).

The serial-in/parallel-out shift register architecture includes the benefits of accommodating any numbered grouping of parallel data (e.g., even/odd bit quantity of encoded bits) at the expense of a relatively large number of latches operating at full clock rates (e.g., 4 Gbits per second). Accordingly, a normalized power calculation for the serial-in/parallel-out shift register-type architecture results in normalized power of:

$$P \approx 10f + 10f/10 = 11f$$

where 10f is the power from the serially configured shift registers 304(1-10) and 10f/10 is the power from the parallelly configured shift registers 310(1-10) operating at one-tenth the serial input clock rate.

Figure 4:
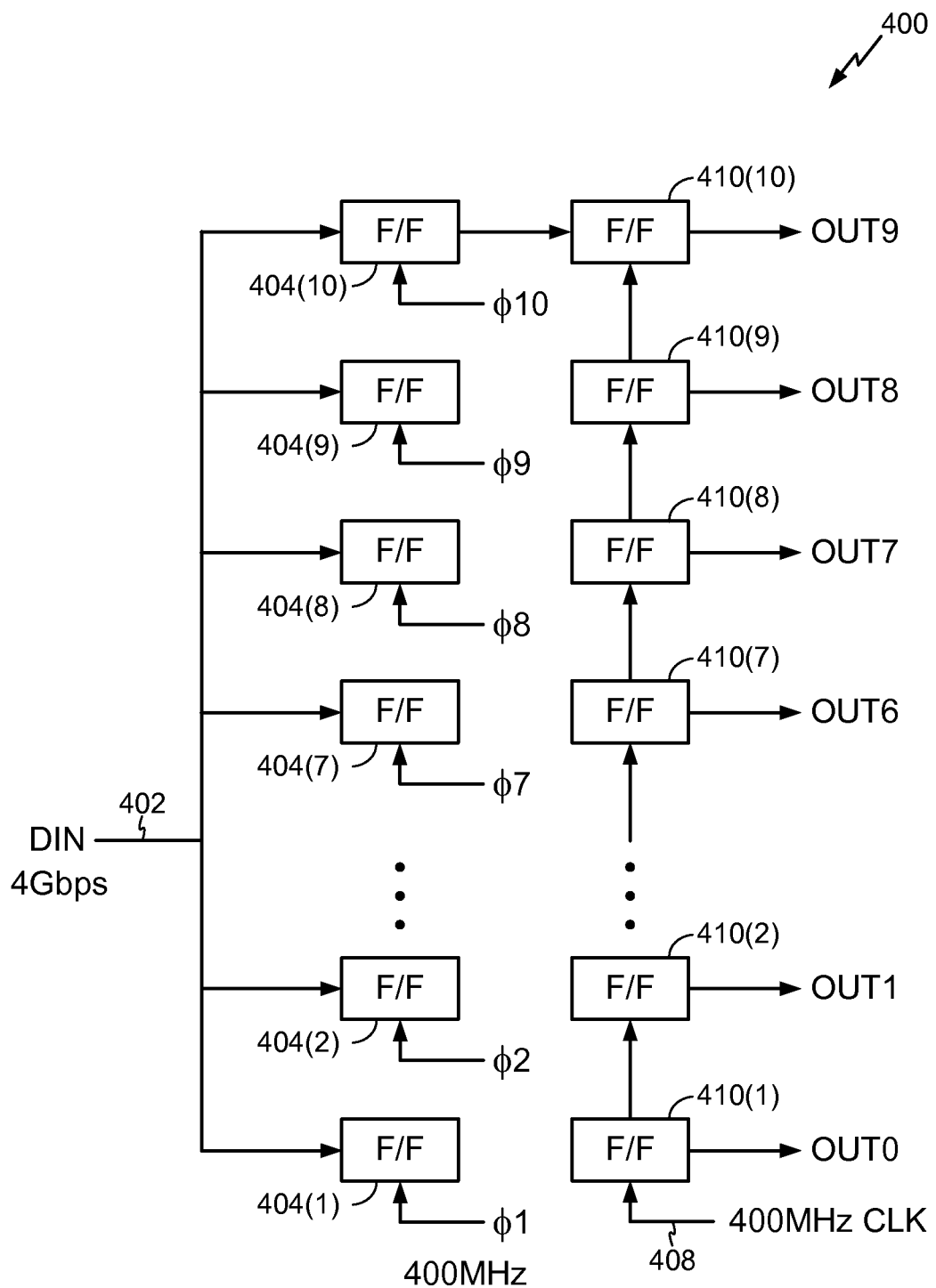
FIG. 4 illustrates a deserializer configured according to a multiphase clock shift register-type architecture.

FIG. 4 illustrates a deserializer 400 configured according to a multiphase clock shift register-type architecture. Serial data 402 is illustrated as being received over a link at, for example, a 4 Gbits per second data rate and is multiphase clocked into serial shift registers 404 according to multiple phases of an input clock resulting in an effective divide-by-N clock of f/10 for a 8B/10B encoded serial bit stream where N is equal to ten resulting in ten parallelly configured shift registers 404(1-10). Accordingly, when ten bits of serial data have been multiphase clocked into shift registers 404(1-10), a divide-by-N clock 408 latches a 10-bit group of parallel data into ten parallelly configured shift registers 410(1-10).

The multiphase shift register architecture includes the benefits of accommodating any numbered grouping of parallel data (e.g., even/odd bit quantity of encoded bits) at the expense of a relatively complex and expensive generation of a multiphase clocking scheme (e.g., $\Phi 1, \Phi 2, \ldots, \Phi N,$). Accordingly, a normalized power calculation for the multiphase shift register architecture results in normalized power of:

$$P \approx 10f/10 + 10f/10 = 2f$$

where 10f/10 is the power from the multiphase configured shift registers 404(1-10) effectively clocking at a divide-by-N clock rate and 10f/10 is the power from the parallelly configured shift registers 410(1-10) clocking at a divide-by-N clock rate. Note, the above power calculation does not take into account the yet additional power required to generate a highly precise clock phase control of, for example, ten samples per 4 Gbits per second. Specifically, a high-precision clock generally requires a high-precision phase locked loop (PLL) circuit which consumes a significant amount of power.

Figure 5:
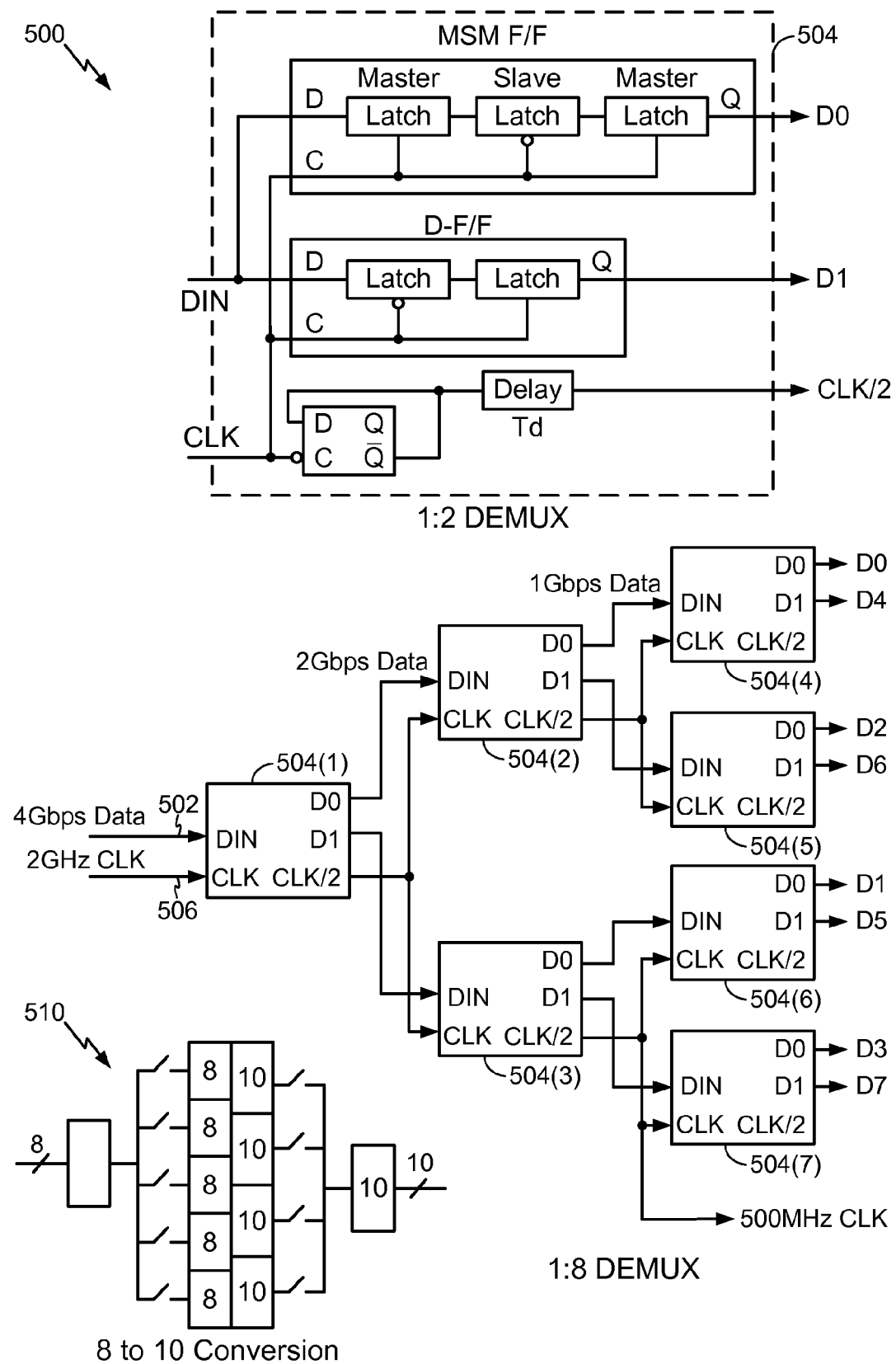
FIG. 5 illustrates a deserializer configured according to an asynchronous tree demultiplexer-type architecture.

FIG. 5 illustrates a deserializer 500 configured according to an asynchronous tree demultiplexer-type architecture. Serial data 502 is illustrated as being received over a link at, for example, a 4 Gbits per second data rate and is clocked into a 1-to-2 demultiplexer 504(1) according to a half-rate input clock 506 operating, for example, at 2 GHz. A general 1-to-2 demultiplexer 504 is illustrated to include latches configured to receive two bits of serial data at DIN and output two parallel bits of data at D0 and D1. Furthermore, the general 1-to-2 demultiplexer 504 is further configured with a clock divider to receive an input clock CLK at a full rate and generate an output clock CLK/2 at half the rate of the input clock.

While in the present example of an 8B/10B serially encoded bit stream, N is equal to ten, the asynchronous tree demultiplexer-type architecture branches according to powers of two. Specifically, demultiplexer 504(1) branches to 1-to-2 demultiplexers 504(2-3) which further branch to 1-to-2 demultiplexers 504(4-7) which yet further generate eight output bits D0-D7. Accordingly, the asynchronous tree demultiplexer architecture further must buffer five eight-bit groups of parallel data in order to re-group the forty bits of data into four ten-bit groups according to the 8B/10B encoding scheme. Therefore, the deserializer 500 further includes an 8-to-10 conversion circuit 510 configured to buffer five eight-bit groups of parallel data for re-grouping the forty bits of data into four ten-bit groups.

The asynchronous tree demultiplexer architecture includes the benefits of a half-rate clocking of data since each 1-to-2 demultiplexer latches a first input data on a first edge of the input clock and a second input data on a second edge of the input clock at the expense of not directly supporting encoding structures other than power of two encoding. Accordingly, a normalized power calculation for the asynchronous tree demultiplexer architecture results in normalized power of:

$P \approx 3f/2 + 6f/4 + 12f/8 + 2f = 6.5f$ where 3f/2 is the power from the 1-to-2 demultiplexer 504(1) and 6f/4 is the power from the 1-to-2 demultiplexers 504(2-3) and 12f/8 is the power from the 1-to-2 demultiplexers 504(4-7) and 2f is the normalized power from the 8-to-10 conversion circuit 510.

Figure 6:
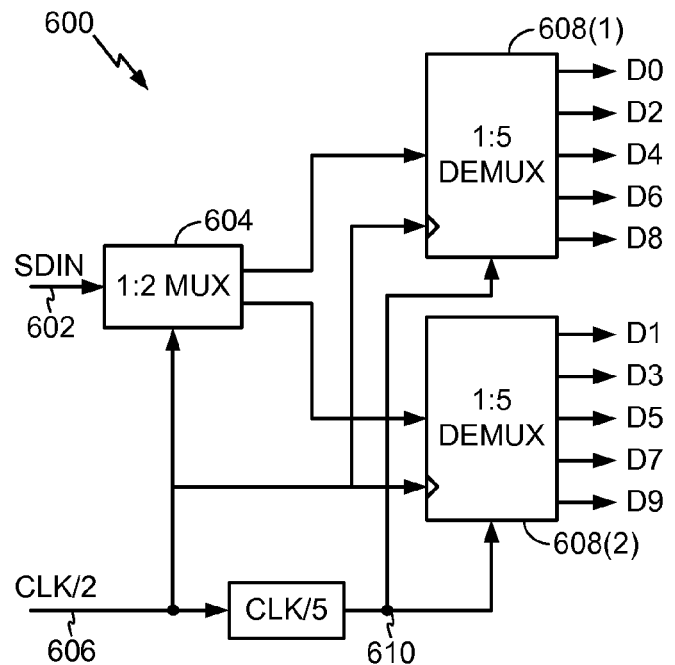
FIG. 6 illustrates a deserializer configured according to a cascade-type architecture.
Figure 6:
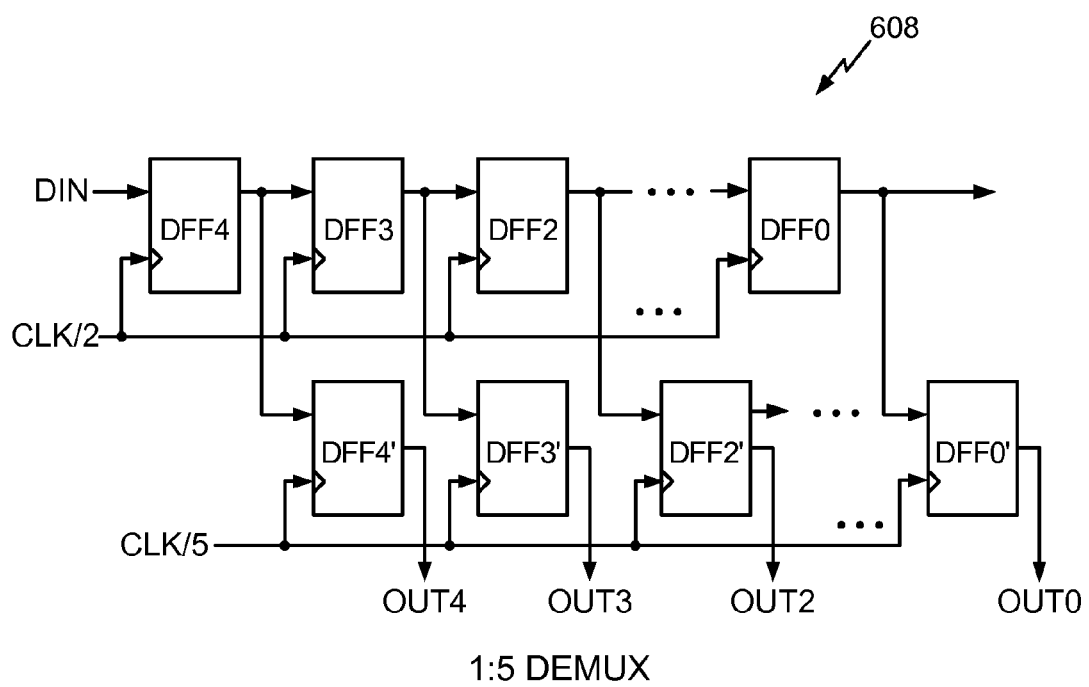

FIG. 6 illustrates a deserializer 600 configured according to a cascade-type architecture. Serial data 602 is illustrated as being received over a link at, for example, a 4 Gbits per second data rate and is clocked into a 1-to-2 demultiplexer 604 according to a half-rate input clock 606 operating, for example, at 2 GHz. A general 1-to-2 demultiplexer 604 is generally configured like the 1-to-2 demultiplexer 504 of FIG. 5 including latches configured to receive two bits of serial data at DIN and output two parallel bits of data at D0 and D1.

While in the present example of an 8B/10B serially encoded bit stream N equals ten, the cascade-type deserializer architecture further comprises two 1-to-5 serial demultiplexers 608 similar to the serially configured shift registers 304 and the ten parallelly configured shift registers 310 of FIG. 3.

The D0 and D1 outputs of the 1-to-2 demultiplexer 604 are respectively coupled to the inputs of 1-to-5 demultiplexers 608(1-2) which are clocked according to a divide-by-five clock 610. Accordingly, the cascade-type deserializer architecture generates a ten-bit parallel group D0-D9 of serial data bits.

The cascade-type deserializer architecture includes the benefits of a half-rate clocking of data since each 1-to-2 demultiplexer latches a first input data on a first edge of the input clock and a second input data on a second edge of the input clock 606 at the expense of a relatively large number of latches operating at high clock rates. Accordingly, a normalized power calculation for the cascade-type deserializer architecture results in normalized power of:

$P \approx 3f/2 + 10f/2 + 10f/5 = 8.5f$ where 3f/2 is the power from the 1-to-2 demultiplexer 604, 10f/2 is the power from the 1-to-5 demultiplexer 608(1) and 10f/5 is the power from the 1-to-5 demultiplexer 608(2).

Figure 7:
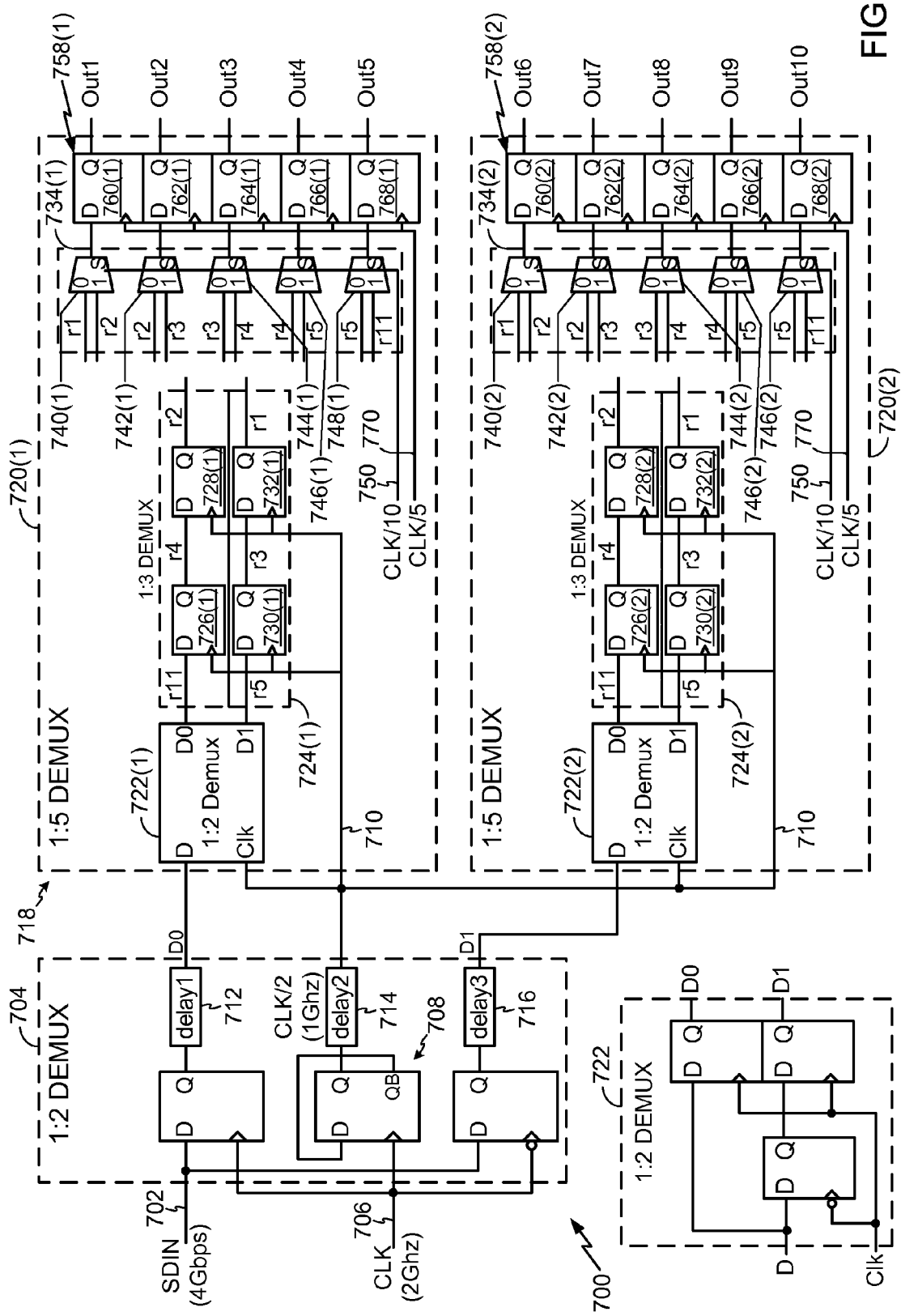
FIG. 7 illustrates a deserializer configured according to a hybrid-type architecture.

FIG. 7 illustrates a deserializer 700 configured according to a hybrid-type architecture in accordance with an exemplary embodiment. Serial data on SDIN 702 is illustrated as being received over a link, for example, at a 4 Gbits per second data rate and is clocked into a first stage deserializer illustrated as a 1-to-2 demultiplexer 704 according to a half-rate input clock 706 operating, for example, at 2 GHz. A 1-to-2 demultiplexer 704 is illustrated to include latches configured to receive two bits of serial data on SDIN 702 and output two parallel bits of data at D0 and D1. Furthermore, the 1-to-2 demultiplexer 704 is further configured with a clock divider 708 to receive an input clock 706 at an input clock rate and generate an output clock 710 at half the rate of the input clock 706. According to the present example, the input clock rate is 2 GHz and the output clock rate is 1 GHz. Delay elements 712-716 are configured based upon the actual performance of the various components in order to avoid circuit "race" conditions as understood by those of ordinary skill in the art and are not further defined herein.

Deserializer 700 further includes second stage deserializers illustrated as a parallel arrangement of 1-to-5 demultiplexers 720(1-2). It should be noted that 1-to-5 demultiplexers 720 are not each configured as shift register-type 1-to-5 demultiplexers but include asynchronous elements. Specifically, each demultiplexer 720 includes an asynchronous 1-to-2 demultiplexer 722 configured to receive one of D0 or D1 from the 1-to-2 demultiplexer 704 and generate outputs D0 and D1 in response to clock 710.

The 1-to-5 demultiplexers 720 further comprise serial shift registers coupled to the D0 and D1 outputs of 1-to-2 demultiplexer 722 designated herein as 1-to-3 demultiplexers 724. It should be noted that the 1-to-3 demultiplexers 724 are not true one-input to three-output demultiplexers but rather function as a series of shift registers for retaining serial input data for periodic selection as outputs of the deserializer 700. Specifically, the 1-to-3 demultiplexers 724 include series configured shift registers 726, 728 coupled to D0 of 1-to-2 demultiplexer 722 and series configured shift registers 730, 732 coupled to D1 of 1-to-2 demultiplexer 722. The series configured shift registers 726-732 are clocked by clock 710 generated by the 1-to-2 demultiplexer 704. The 1-to-3 demultiplexers 724 further include output signals r1, r2, r3, r4, r5 and r11 described below.

The 1-to-5 demultiplexers 720 further comprise selectors 734 each including, in the present example, five 2-to-1 multiplexers 740-748. Each of the two inputs to the 2-to-1 multiplexers 740-748 connect to the "r" output signals of the demultiplexer 724. Specifically, the two inputs to the multiplexer 740 are connected to output signals r1 and r2, the two inputs to the multiplexer 742 are connected to output signals r2 and r3, the two inputs to the multiplexer 744 are connected to output signals r3 and r4, the two inputs to the multiplexer 746 are connected to output signals r4 and r5, and the two inputs to the multiplexer 748 are connected to output signals r5 and r11. The inputs to the 2-to-1 multiplexers 734 are selectively controlled by a divide-by-ten clock 750, which in the present example of a 4 Gbits per second serial input data stream operates at 200 MHz. As will be noted in the timing diagram of FIG. 8, clock 750 does not necessarily exhibit a 50/50 duty cycle.

The 1-to-5 demultiplexers 720 further comprise parallel latches 758 coupled to the outputs of selectors 734 for receiving and latching the respectively selected output signals r1, r2, r3, r4, r5 and r11 as determined by selectors 734. Parallel latches 758 are selectively latched by a divide-by-five clock 770, which in the present example of a 4 Gbits per second serial input data stream operates at 400 MHz. Parallel latch 758(1) outputs a first five of the ten bits of a demultiplexed 8B/10B serial stream as outputs OUT1-OUT5. Similarly, parallel latch 758(2) outputs a second five of the ten bits of a demultiplexed 8B/10B serial stream as outputs OUT6-OUT10. As will be noted in the timing diagram of FIG. 8, clock 770 does not necessarily exhibit a 50/50 duty cycle.

The hybrid-type deserializer architecture includes the benefits of a half-rate clocking of data since each 1-to-2 demultiplexer latches a first input data on a first edge of the input clock and a second input data on a second edge of the input clock. The hybrid-type deserializer of FIG. 7 further benefits from less power consumption because of fewer latches and a lower execution frequency. Accordingly, a normalized power calculation for the hybrid-type deserializer architecture results in normalized power of:

$$P \approx 2f/2 + 14f/4 + 10f/20 = 5f.$$

Figure 8:
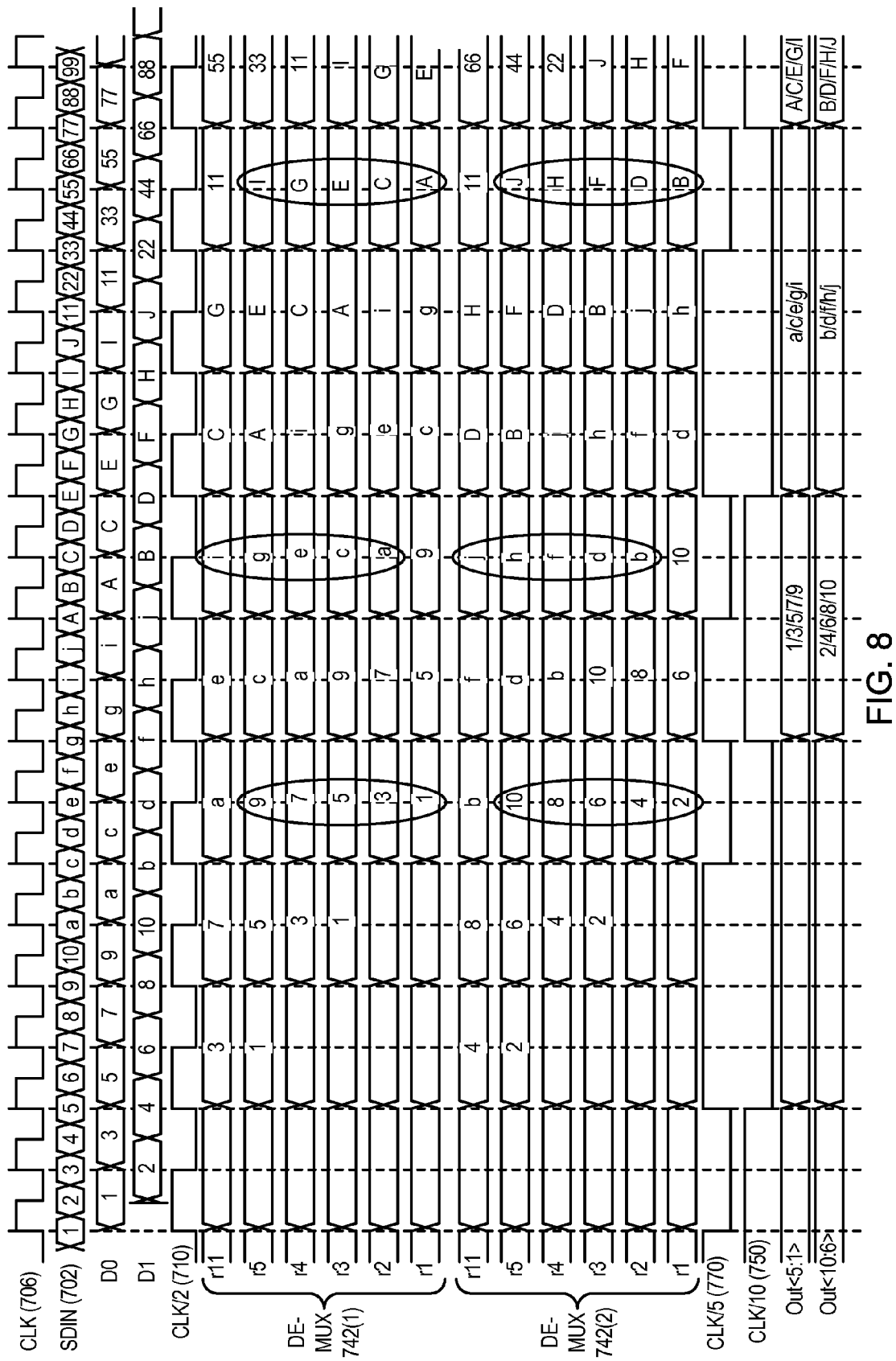
FIG. 8 is a timing diagram of the deserializer of FIG. 7.

FIG. 8 is a timing diagram of the deserializer 700 of FIG. 7, in accordance with an exemplary embodiment. As illustrated, groups of ten bits of input serial data SDIN 702 are illustrated as "1 2 3 4 5 6 7 8 9 10", "a b c d e f g h i j", "A B C D E F G H I J", and "11 22 33 44 55 66 77 88 99 ...". The circled areas of the "r" output signals represent a time alignment of the respective groups of ten bits. The initial six cycles of CLK 706 allow the pipelined architecture of deserializer 700 to become primed with serial data. Also illustrated in FIG. 8 is the asymmetric arrangement of clock 750 and clock 770. Such asymmetry allows for an output from deserializer 700 that is not restricted to a $2^N$ quantity of outputs.

Figure 9:
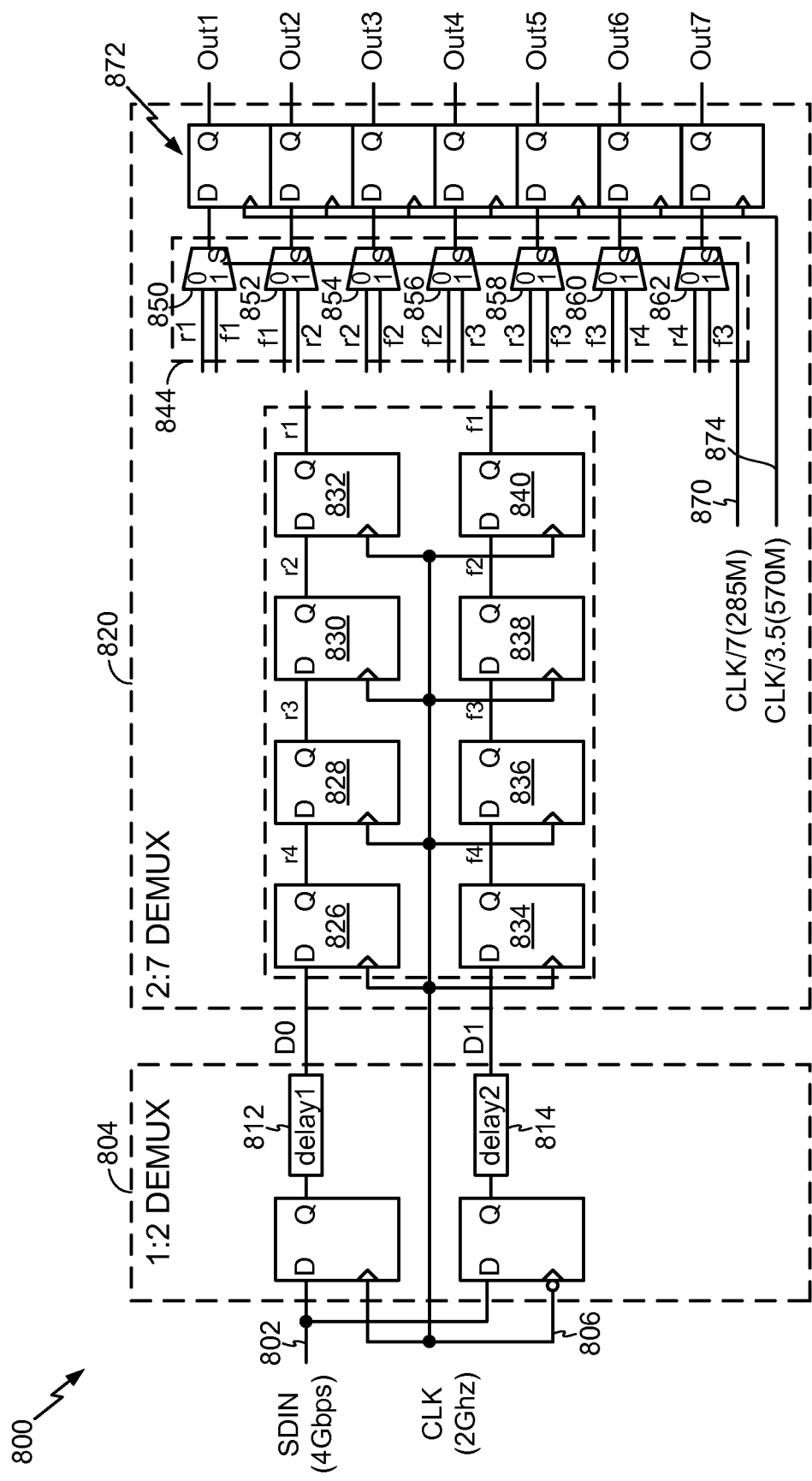
FIG. 9 illustrates a deserializer configured according to another hybrid-type architecture.

FIG. 9 illustrates a deserializer 800 configured according to a hybrid-type architecture in accordance with another exemplary embodiment. Serial data on SDIN 802 is illustrated as being received over a link, for example, at a 4 Gbits per second data rate and is clocked into a first stage deserializer illustrated as a 1-to-2 demultiplexer 804 according to a half-rate input clock 806 operating, for example, at 2 GHz. A 1-to-2 demultiplexer 804 is illustrated to include latches configured to receive two bits of serial data on SDIN 802 and output two parallel bits of data at D0 and D1. Delay elements 812, 814 are configured based upon the actual performance of the various components in order to avoid circuit "race" conditions as understood by those of ordinary skill in the art and are not further defined herein.

Deserializer 800 further includes second stage deserializer illustrated as a 2-to-7 demultiplexer 820. It should be noted that the 2-to-7 demultiplexer 820 is not configured as shift register-type 2-to-7 demultiplexer but is configured to receive D0 and D1 from the 1-to-2 demultiplexer 804 and generate signals for latching. It should be noted that the 2-to-7 demultiplexer 820 functions as a series of shift registers for retaining serial input data for periodically selecting as outputs of the deserializer 800. Specifically, the 2-to-7 demultiplexer 820 includes series configured shift registers 826-832 coupled to D0 of 1-to-2 demultiplexer 804 and series configured shift registers 834-840 coupled to D1 of 1-to-2 demultiplexer 804. The series configured shift registers 826-840 are clocked by clock 806. The 2-to-7 demultiplexer 824 further includes output signals r1, r2, r3, r4, f1, f2, f3, f4 described below.

The 2-to-7 demultiplexer 820 further comprises selector 844 including, in the present example, seven 2-to-1 multiplexers 850-862. Each of the two inputs to the 2- to 1 multiplexers 850-862 connect to the "r" or "f" output signals of the shift registers 826-840. Specifically, the two inputs to the multiplexer 850 are connected to output signals r1 and f1, the two inputs to the multiplexer 852 are connected to output signals f1 and r2, the two inputs to the multiplexer 854 are connected to output signals r2 and f2, the two inputs to the multiplexer 856 are connected to output signals f2 and r3, the two inputs to the multiplexer 858 are connected to output signals r3 and f3, the two inputs to the multiplexer 860 are connected to output signals f3 and r4, and the two inputs to the multiplexer 862 are connected to output signals r4 and f3. The inputs to the 2-to-1 multiplexers 844 are selectively controlled by a divide-by-seven clock 870, which in the present example of a 4 Gbits per second serial input data stream operates at 285 MHz. As will be noted in the timing diagram of FIG. 10, clock 870 does not necessarily exhibit a 50/50 duty cycle.

The 2-to-7 demultiplexer 820 further comprises parallel latches 872 coupled to the outputs of selector 844 for receiving and latching the respectively selected output signals r1, r2, r3, r4, f1, f2, f3 and f4 as determined by selector 844. Parallel latches 872 are selectively latched by a divide-by-3.5 clock 874, which in the present example of a 4 Gbits per second serial input data stream operates at 570 MHz. Parallel latch 872 outputs a group of seven of a demultiplexed seven-bit encoding scheme as outputs OUT1-OUT7. As will be noted in the timing diagram of FIG. 10, clock 874 does not necessarily exhibit a 50/50 duty cycle.

The hybrid-type deserializer architecture includes the benefits of a half-rate clocking of data since each 1-to-2 demultiplexer latches a first input data on a first edge of the input clock and a second input data on a second edge of the input clock. The hybrid-type deserializer of FIG. 9 further benefits from less power consumption because of fewer latches and a lower execution frequency. Accordingly, a normalized power calculation for the hybrid-type deserializer architecture results in normalized power of:

$$P \approx 10f/2 + 7f/14 = 5.5f.$$

Figure 10:
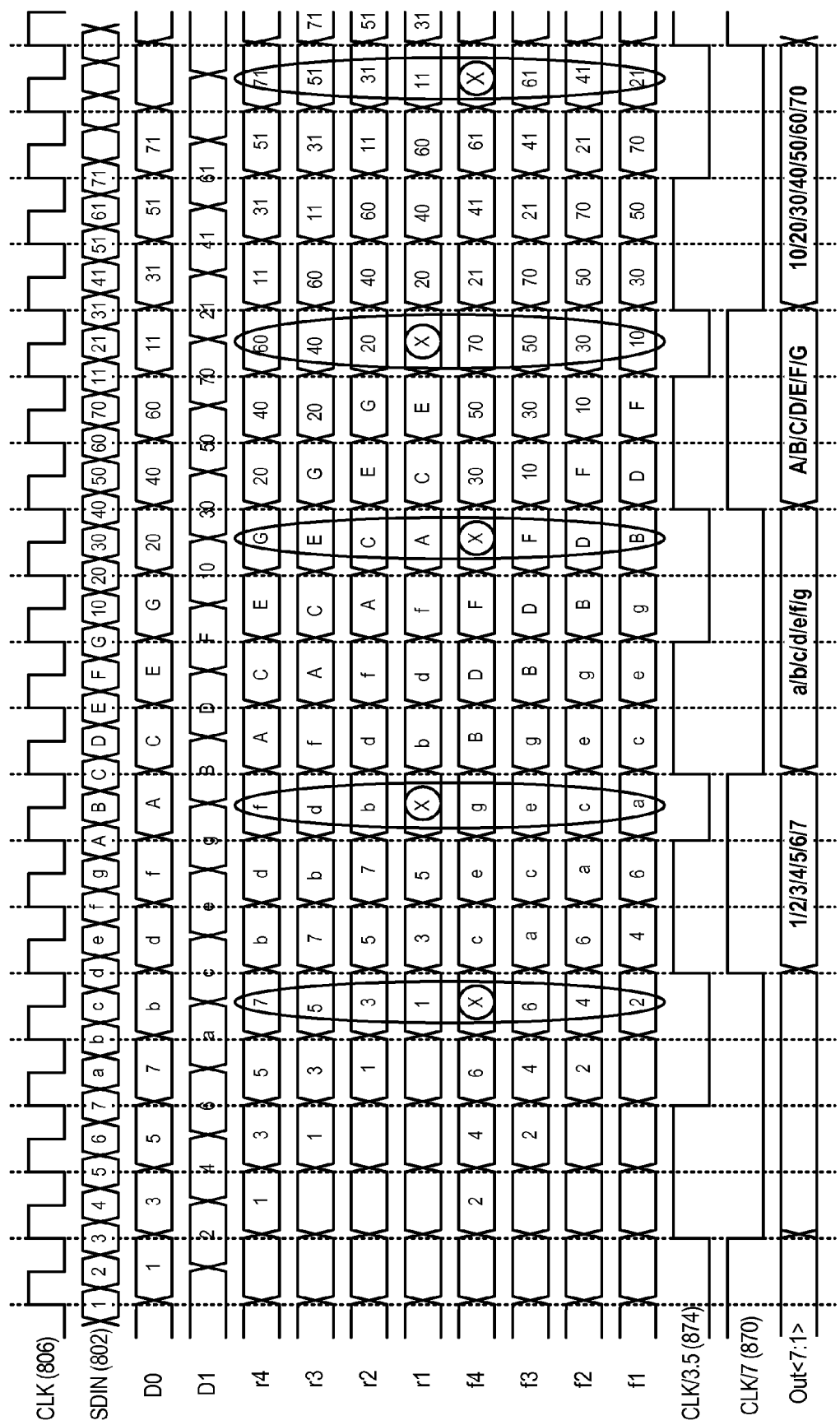
FIG. 10 is a timing diagram of the deserializer of FIG. 9.

FIG. 10 is a timing diagram of the deserializer 800 of FIG. 9, in accordance with an exemplary embodiment. As illustrated, groups of seven bits of input serial data SDIN 802 are illustrated as "1 2 3 4 5 6 7", "a b c d e f g", "A B C D E F G", "10 20 30 40 50 60 70", and "11 21 31 41 51 61 71". The circled groupings of the "r" and "f" output signals represent a time alignment of the respective groups of seven bits. The "X" in the circled groupings indicate "don't care" data for the demultiplexing process. The initial four cycles of CLK 806 allow the pipelined architecture of deserializer 800 to become primed with serial data. Also illustrated in FIG. 10 is the asymmetric arrangement of clock 870 and clock 874. Such asymmetry allows for an output from deserializer 800 that is not restricted to a $2^N$ quantity of outputs. In fact, deserializer 800 may be configured, as illustrated in FIG. 9, to accommodate an odd number of outputs.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A deserializer, comprising:
a first demultiplexer including an input to receive a first serial data stream and first and second outputs to alternatingly output successive bits of the first serial data stream on the first and second outputs;
first and second plurality of shift registers respectively coupled to the first and second outputs; and
a first selector including a plurality of parallel multiplexers each including a plurality of inputs and a selectable output forming a portion of a first parallel data stream, a first input on one of the plurality of multiplexers couples to the first plurality of shift registers and a second input on the one of the plurality of multiplexers couples to the second plurality of shift registers.

2. The deserializer of claim 1, wherein a quantity of the plurality of multiplexers comprises a non-base two quantity.

3. The deserializer of claim 1, wherein a quantity of the plurality of multiplexers comprises an odd number quantity.

4. The deserializer of claim 1, wherein a first input on each of the plurality of multiplexers couples to the first plurality of shift registers and a second input on each of the plurality of multiplexers couples to the second plurality of shift registers.

5. The deserializer of claim 1, wherein the at least one input on the one of the plurality of multiplexers couples to the first plurality of shift registers at a first location along the first plurality of shift registers and a second input on the one of the plurality of multiplexers couples to the second plurality of shift registers at a second location different than the first location along the second plurality of shift registers.

6. The deserializer of claim 1, the plurality of multiplexers are selected according to a clock signal having an asymmetric duty cycle.

7. The deserializer of claim 1, wherein the first demultiplexer and the first and second plurality of shift registers are commonly clocked.

8. The deserializer of claim 1, wherein the first serial data stream comprises 8B/10B encoding.

9. The deserializer of claim 1, further comprising:
a second demultiplexer including an input to receive a second serial data stream and third and fourth outputs to alternatingly output successive bits of the second serial data stream on the first and second outputs;
third and fourth plurality of shift registers respectively coupled to the third and fourth outputs; and
a second selector including a plurality of multiplexers each including a plurality of inputs and a selectable output forming a portion of a second parallel data stream, a first input on one of the plurality of multiplexers couples to the third plurality of shift registers and a second input on the one of the plurality of multiplexers couples to the fourth plurality of shift registers.

10. The deserializer of claim 9, further comprising an input demultiplexer including an input to receive a serial data stream and first and second outputs to alternatingly output successive bits of the serial data stream as the first serial data stream and the second serial data stream.

11. The deserializer of claim 10, wherein the serial data stream comprises 8B/10B encoding.

12. A deserializer, comprising:
an asynchronous demultiplexer to receive a serial data stream; and
first and second demultiplexers respectively coupled to outputs of the asynchronous demultiplexer, the first and second demultiplexers each include a plurality of shift registers, the first and second demultiplexers further comprising a selector including at least one multiplexer having a first input coupled to a first shift register and a second input coupled to a second, different shift register, the selector further outputs a grouping of a non-base two quantity of data in the parallel data stream.

13. The deserializer of claim 12, wherein the serial bit stream comprises 8B/10B encoding.

14. The deserializer of claim 12, wherein the plurality of shift registers operate at half the clock rate of the asynchronous demultiplexer.

15. The deserializer of claim 12, wherein a quantity of outputs of at least one of the first and second demultiplexers comprises a non-base two quanity.

16. A method for deserializing a serial bit stream, comprising:
alternatingly demultiplexing a serial data stream into first and second bit streams;
respectively serially shifting the first bit stream along a first plurality of shift registers and the second bit stream along a second plurality of shift registers; and
selecting at one input of a multiplexer at least a first portion of the first bit stream from the first plurality of shift registers and at a second input of the multiplexer at least a second portion of the second bit stream from the second plurality of shift registers to form a parallel group of data in a parallel data stream.

17. The method of claim 16, wherein selecting further comprises selecting the portions such that the parallel group corresponds to encoding of the serial bit stream.

18. The method of claim 17, wherein the encoding comprises 8B/10B encoding.

19. The method of claim 16, wherein the first and second portions are different in size.

20. The method of claim 16, wherein the quantity of data in the parallel group of data comprises one of a non-base two or odd quantity.

21. The method of claim 16, wherein the serially shifting of the first and second bit streams along the shift registers comprises clocking at half the clock rate of the alternatingly multiplexing of the serial data stream.

22. A handset, comprising:
a serializer to generate a serial data stream from a parallel data stream; and
a deserializer to generate the parallel data stream from the serial data stream, the deserializer, including:
an asynchronous demultiplexer to receive a serial data stream; and
first and second demultiplexers respectively coupled to outputs of the asynchronous demultiplexer, the first and second demultiplexers each include a plurality of shift registers, the first and second demultiplexers further comprising a selector including at least one multiplexer having a first input coupled to a first shift register and a second input coupled to a second, different shift register, the selector to output a non-base two quantity of data in the parallel data stream.

23. The handset of claim 22, wherein the serial bit stream comprises 8B/10B encoding.

24. The handset of claim 22, wherein the plurality of shift registers operate at half the clock rate of the asynchronous demultiplexer.

25. The handset of claim 22, wherein a quantity of outputs of at least one of the first and second demultiplexers comprises a non-base two quantity.

26. A deserializer for deserializing a serial bit stream, comprising:
means for alternatingly demultiplexing a serial data stream into first and second bit streams;
means for respectively serially shifting the first bit stream along a first plurality of shift registers and the second bit stream along a second plurality of shift registers; and
means for selecting at one input of a multiplexer at least a first portion of the first bit stream from the first plurality of shift registers and at a second input of the multiplexer at least a second portion of the second bit stream from the second plurality of shift registers to form a parallel group of data in a parallel data stream.

27. The deserializer of claim 26, wherein the means for selecting further comprises means for selecting the portions such that the parallel group corresponds to encoding of the serial bit stream.

28. The deserializer of claim 27, wherein the encoding comprises 8B/10B encoding.

* * * * *